United States Patent [19]

Wyatt et al.

[11] 4,256,972
[45] Mar. 17, 1981

[54] POWER TRANSFER RELAY CIRCUITRY AND METHOD OF PHASE MEASUREMENT

[75] Inventors: Michael A. Wyatt, Tampa; Robert W. Beckwith, Seminole, both of Fla.

[73] Assignee: Beckwith Electric Co., Inc., Largo, Fla.

[21] Appl. No.: 37,680

[22] Filed: May 10, 1979

[51] Int. Cl.³ .............................. H02J 9/06; H02J 3/08
[52] U.S. Cl. ...................................... 307/68; 307/87; 307/152
[58] Field of Search .................. 307/87, 64, 68, 85, 307/86, 152; 322/19, 24; 361/85

[56] References Cited

U.S. PATENT DOCUMENTS

| | | | |
|---|---|---|---|
| 3,491,248 | 1/1970 | Beckwith | 307/87 |
| 3,599,007 | 8/1971 | Martin | 307/87 |
| 3,794,846 | 2/1974 | Schlicher | 307/87 |
| 4,031,407 | 6/1977 | Reed | 307/87 |

Primary Examiner—L. T. Hix
Assistant Examiner—Stafford D. Schreyer
Attorney, Agent, or Firm—Leo J. Aubel

[57] ABSTRACT

Power transfer relay circuitry is disclosed for providing synchronous transfer of power such as from an auxiliary source or system to a motor or motor bus; the circuitry effects the transfer of power when the phase difference between the motor bus and the auxiliary power source is very nearly zero degrees.

5 Claims, 10 Drawing Figures

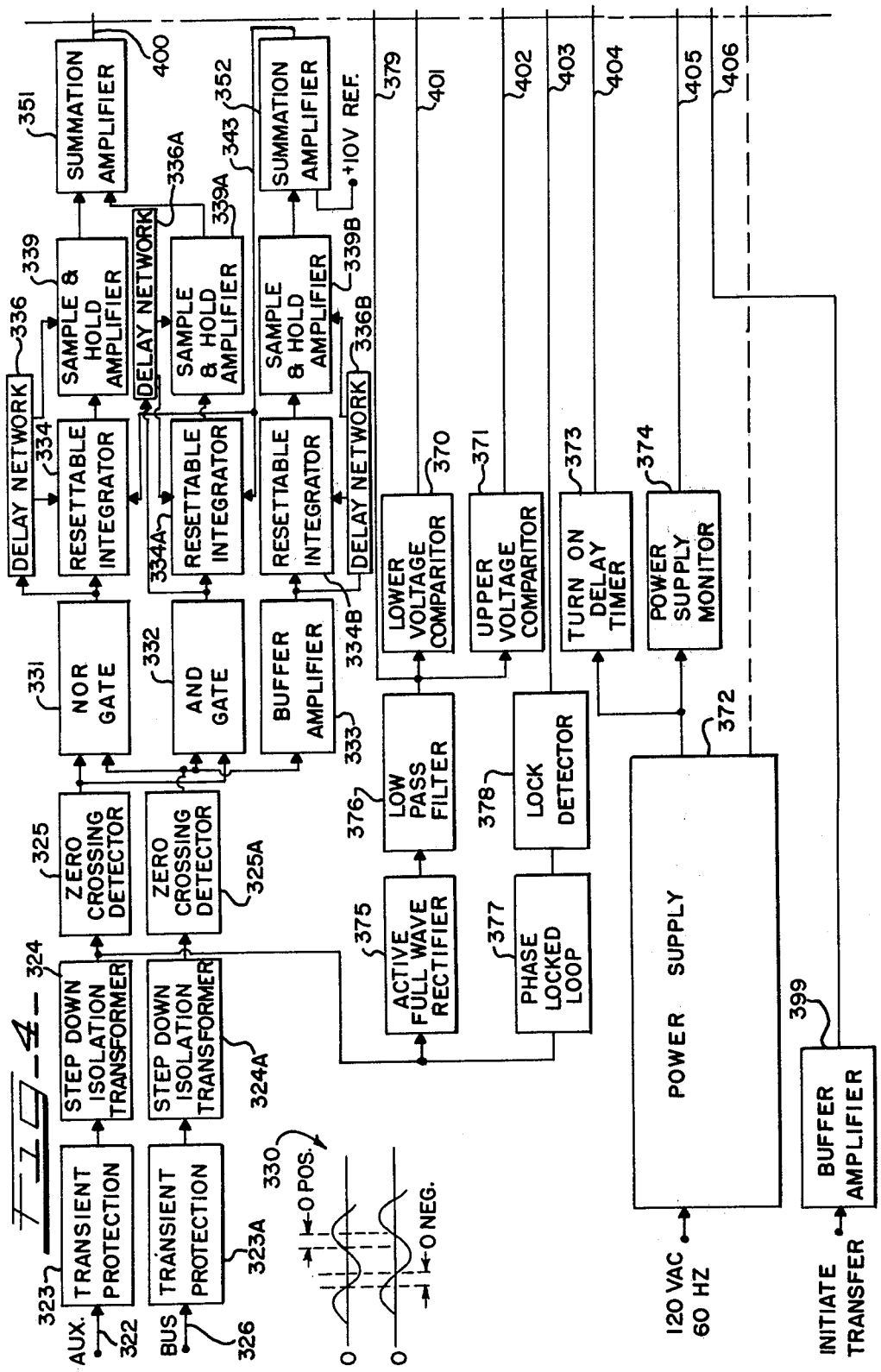

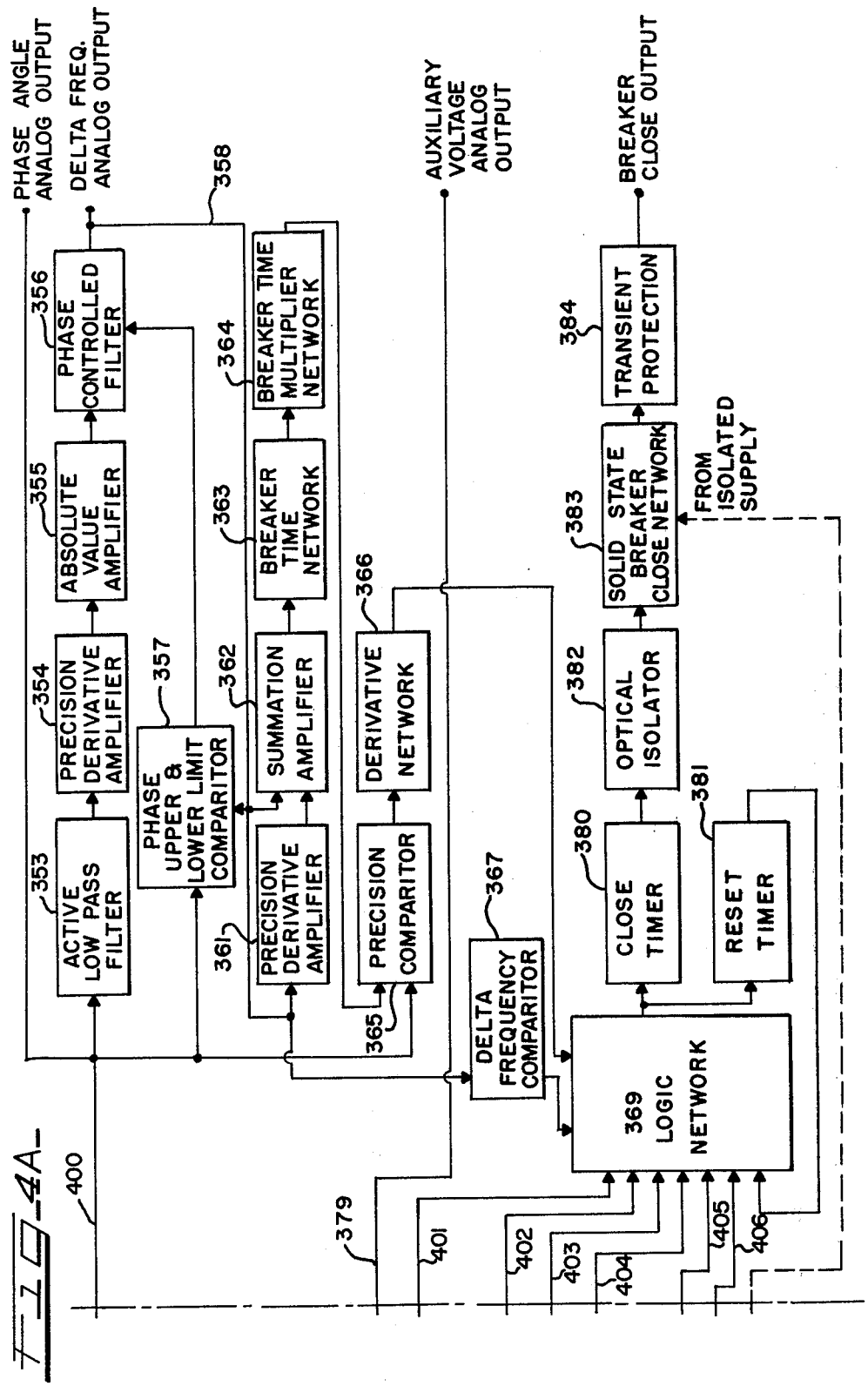

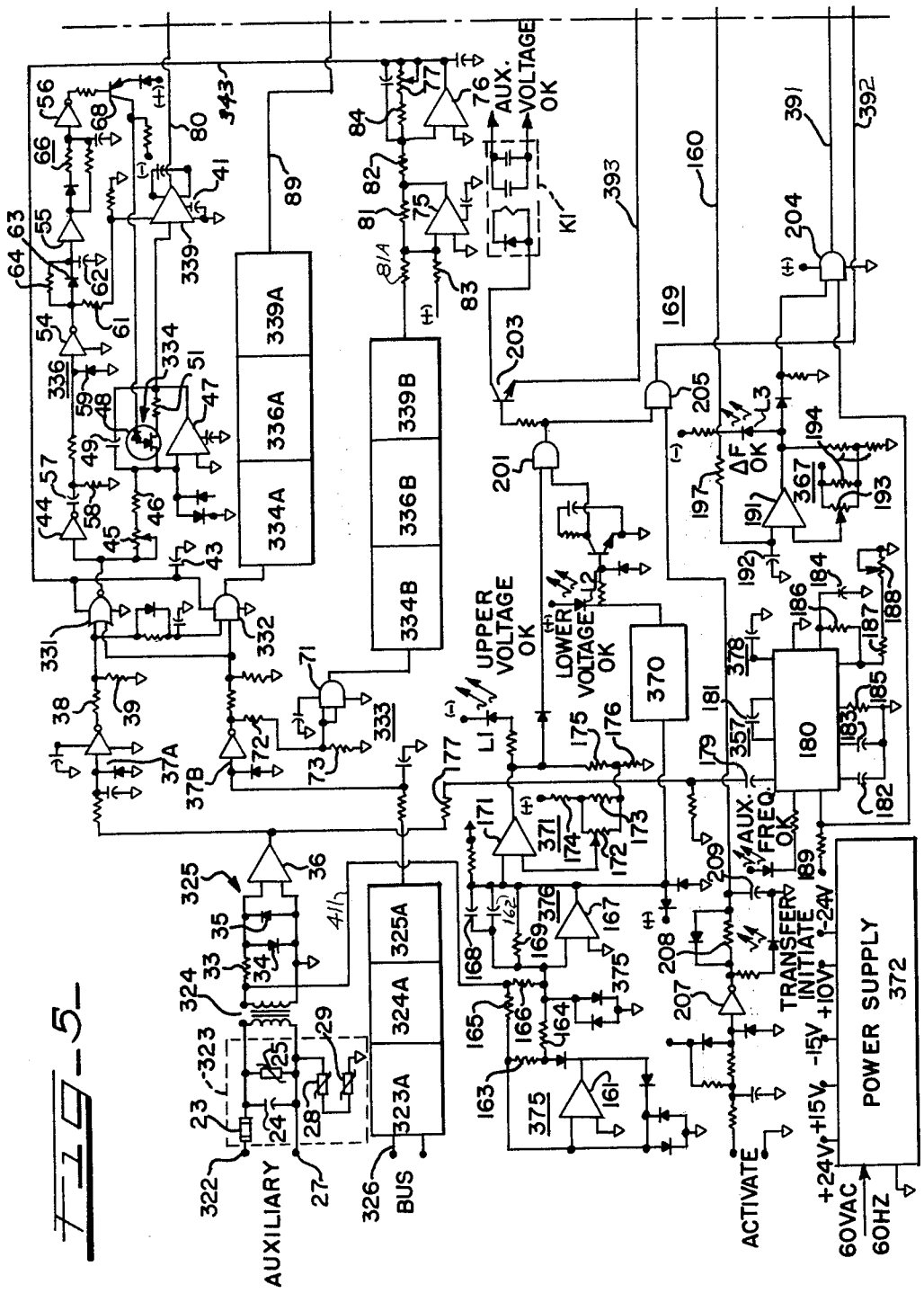

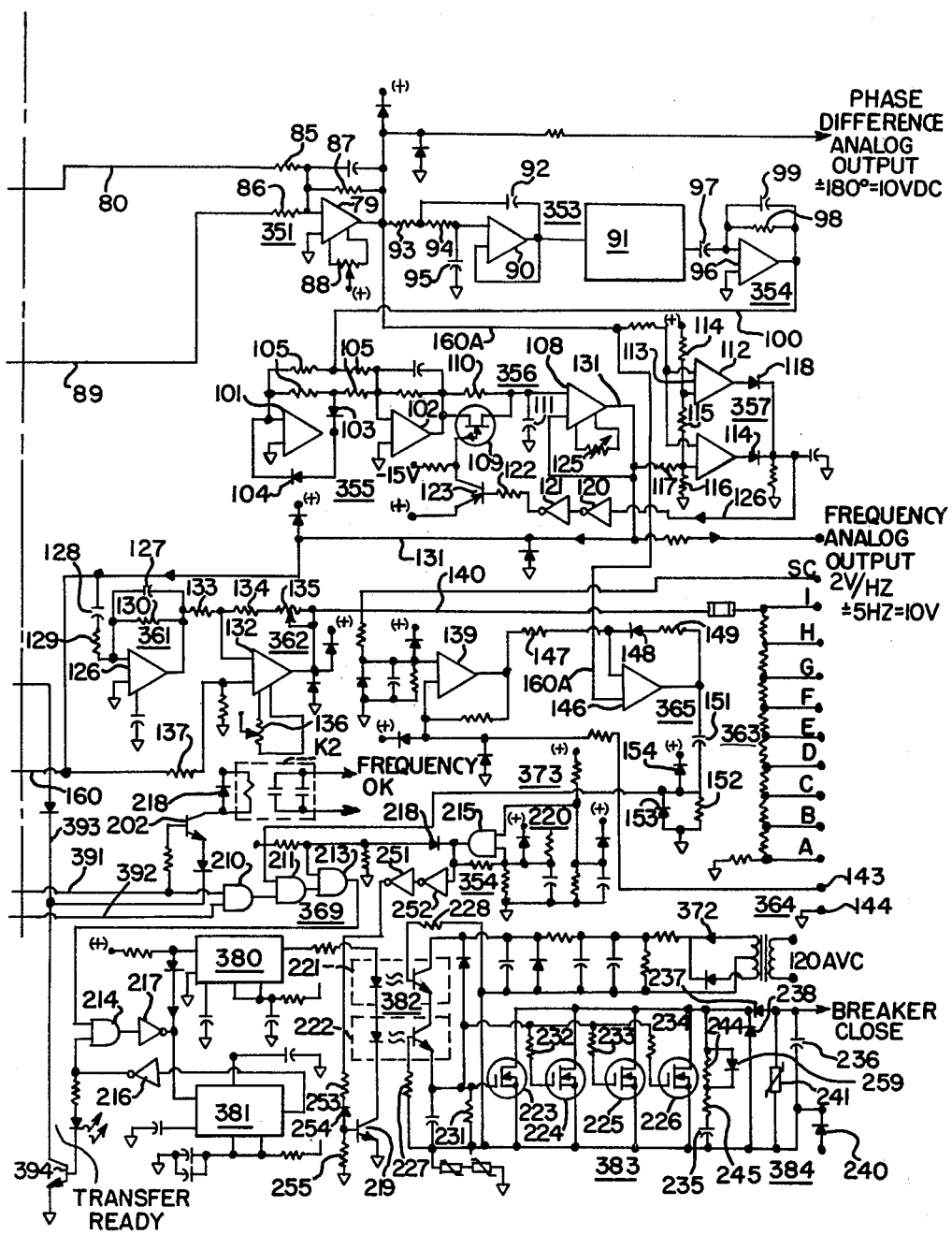
FIG_5A_

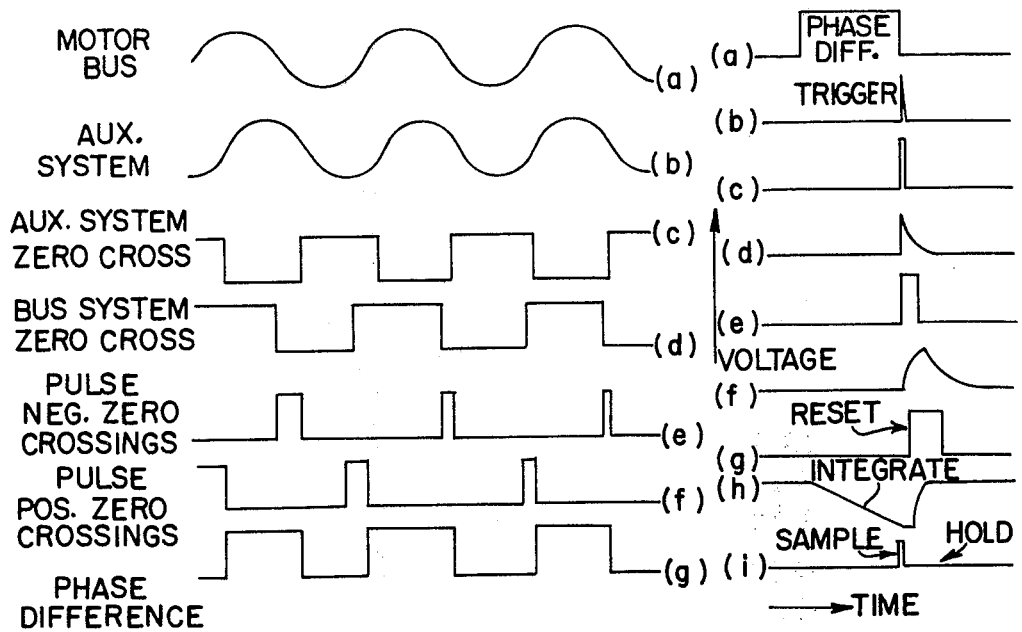
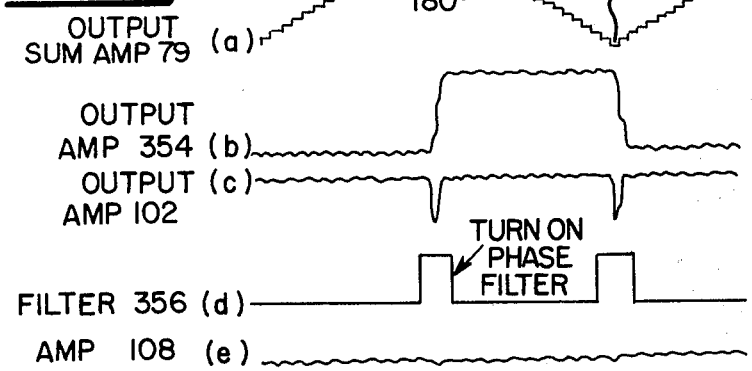
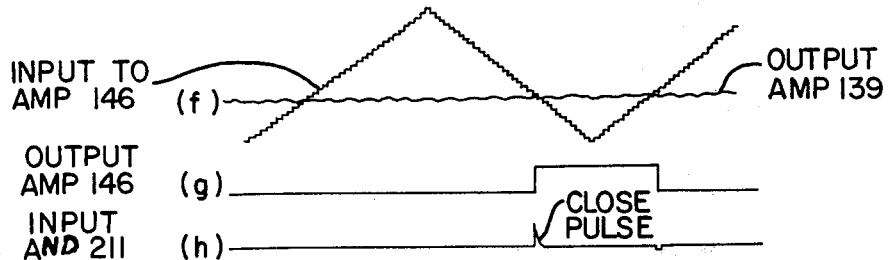

POWER TRANSFER RELAY CIRCUITRY AND METHOD OF PHASE MEASUREMENT

BACKGROUND OF THE INVENTION

Changing electrical power system needs in the last decade have placed a more stringent demand for the rapid transfer of power feeding a large motor bus from a main source of power, on which a fault has occurred, to an auxiliary source which will not power the motor or motor bus. Various methods are currently used for providing such transfer of power from the main source to the auxiliary source. One method has been to utilize two breakers, one coupling from the motor bus to the main source of power and the second breaker coupling from the motor bus to the auxiliary source of power. Closing of the second breaker is initiated, and the tripping or opening of the first breaker is accomplished by the same electrical contact. This requires the closing time of the second breaker to always be slower than the tripping time of the first breaker. If for some reason the foregoing does not occur in the exact time sequences stated, fault current can flow momentarily through the station service transformers resulting in the dramatic failure of the transformers.

A second method has been to initiate closing of a second breaker with a contact on the first breaker. However, in this method the transfer time may often be so long as to produce a worst case phase angle between the induced motor voltage and the new source. This can produce damaging stress on the motor shaft.

A third method lets the motor voltage decay to 0.25 of the rated unit voltage. At this value, the worst case current inrush is within the motor design limit. The time required for this decay to take place, however, may be so long that an undesired or damaging plant shutdown may occur.

Note as further prior art, U.S. Pat. No. 3,491,248, entitled Power Transmission Line Switch Control System, issued to Robert W. Beckwith on Jan. 20, 1970. U.S. Pat. No. 3,491,248 discloses a system for controlling the automatic closure of the contacts of a selected circuit breaker connected between a bus and a power line. The voltages on the bus and line sides of the selected breaker are connected to a controller unit and the controller effects automatic closure of the selected breaker if the proper voltage, frequency and phase matching conditions exist between the bus and power line. While the device of U.S. Pat. No. 3,491,248 provides satisfactory service for a number of applications, present-day requirements dictate a need for much faster operating transfer relay systems.

Surveys of the market place indicate that a fast transfer relay circuit is needed in a number of applications to quickly establish the closing of the breaker to an alternate source of station power when fault causes tripping of the main circuit breakers out of a generator plant. One specific application is, for instance, in a nuclear plant wherein the alternate source must be connected to provide power to the system within seconds otherwise the plant will automatically shutdown. In a coal fired plant, the critical time may be even shorter since slowing down of the induced draft fan can cause a boiler explosion due to the inertia of air coming into the boiler.

Accordingly, prior art methods and devices do not meet certain present day demands. More specifically, the power transfer relay circuitry of the invention meets the requirement for a system providing safe, high-speed synchronous transfer of power to a large rotating electrical machine from one source of power to another source.

Refer now to FIG. 1 of the drawings which shows a simplified, typical generating plant complex 9. Under normal conditions, the generator 21 is used to provide power through the main transformer and a first circuit breaker 11 to the motor bus 15. A fault in the system 18, such as a fault in the main transformer 16 which results in the emergency shutdown of the generator would, of course, also cause breaker 11 to open and interrupt power to the motor bus 15. As mentioned above, it is desirable to restore power to the motor bus as quickly as possible without damaging the rotating equipment. This can be accomplished by closing a second circuit breaker 12; providing a means is available to quickly check synchronism between an auxiliary power source or system 17 and the varying frequency of the induced voltage of the rotating equipment connected to the motor bus 15. The inventive system shown in dotted lines and labeled 10, provides a means of verifying the synchronization of the auxiliary source with the frequency of the motor bus, and provides a means for properly initiating the closing of the breaker 12. The inventive system includes the capability of predicting the point in time when the proper phase relation between the voltages will exist, and of initiating breaker closing so that safe and synchronous restoration of the service results. More basically, the inventive transfer relay circuitry causes contacts of breaker 12 to close when the phase difference between the motor bus frequency and the auxiliary source frequency is very nearly 0°, to thereby minimize transient power flow. Thus, the present invention automatically effects the closure of a circuit breaker to connect an auxiliary system or source of power, rapidly and safely, to a motor bus when a fault occurs in the main power source or system.

DESCRIPTION OF THE DRAWINGS

Further objects of the invention, together with additional features contributing thereto, and advantage accruing therefrom will be apparent from the following description of one embodiment of the invention when read in conjuction with the accompanying drawings wherein:

FIGS. 4 and 4A comprise a block diagram of the inventive system or power transfer relay circuitry;

FIGS. 5 and 5A comprise a detailed schematic diagram of the inventive relay circuitry; and FIGS. 6, 7 and 8 comprise waveforms useful in explaining the method of phase measurement.

SUMMARY OF INVENTION

The inventive power transfer relay circuitry comprises a solid state circuitry which provides a safe, high-speed synchronous transfer of power feeding a motor bus from one source of power to a second source of power.

The power transfer relay circuitry controls the precision closing of the contacts of a circuit breaker effecive between a bus and the second source of power when a fault occurs in the main power source system. Transfer of power is effected at the first available synchronous condition. The phase error in closing will be the sum of the internal power transfer relay error and that caused by tolerance in the breaker closing time. It has been found that for typical motor transfer systems the phase error of the power transfer relay is within the limits of plus or minus five degrees.

The inventive circuitry is also an excellent automatic synchronizer providing breaker closing functions to a high degree of precision down to extremely low slip rates. Also the inventive circuitry follows rapidly changing speed characteristics and makes it a very precise means of synchronizing wind turbine or hydrogenerators whose speed is likely to fluctuate rapidly.

Figure 3:
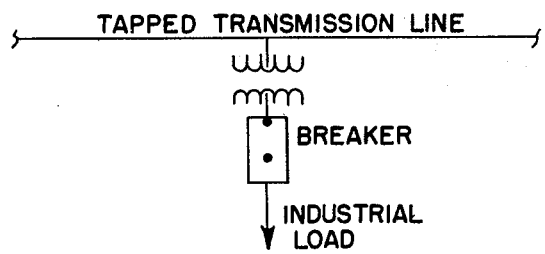
FIG. 3 is sketch depicting an additional system application for the inventive relay circuitry.

The power transfer relay circuitry can also be utilized with large industrial loads fed by a tapped transmission line, see FIG. 3. In such cases a line fault would result in clearing of the faulted line, and a high-speed reverse power relay could be used to trip the industrial breaker and initiate operation of the inventive transfer relay which would then synchronously restore power to the industrial load following a high-speed reclosing of the line breakers.

Further, in many instances, industries have found that their critical processes necessitate installation of an emergency source of power which can be used if an interruption of service by the power company occurs. In cases where there is no cooperative generation of power, the power company has installed a second feeder from a separate substation. In such situations, the first feeder line is normally capable of supplying the normal full plant load and the second feeder has a capacity to handle only the critical load and is for emergency use only. In such cases, a fast synchronous transfer of power is required for process continuity. Accordingly, if the two feeders differ by a phase angle due to routing, the power transfer relay can quickly provide the required power transfer. Once a main feeder is restored, the transfer relay can be reconnected so as to provide the means necessary to restore the motor load to the primary source.

The power transfer relay circuitry includes zero crossing detectors for determining when the motor load frequency waveform is crossing zero level and a second device for sensing when the auxiliary source also is crossing zero. Circuitry is provided for processing a signal including a first subcircuit which compares the phase of the motor load and the auxiliary source to provide a phase difference analog output. A second subcircuit provides an absolute auxiliary voltage analog output. A third subcircuit calculates the time derivative of phase difference frequency. An additional subcircuit further provides a control signal when the foregoing outputs are within a selected range to actuate the triggering of the circuit breaker.

DESCRIPTION OF INVENTION

Figure 1:
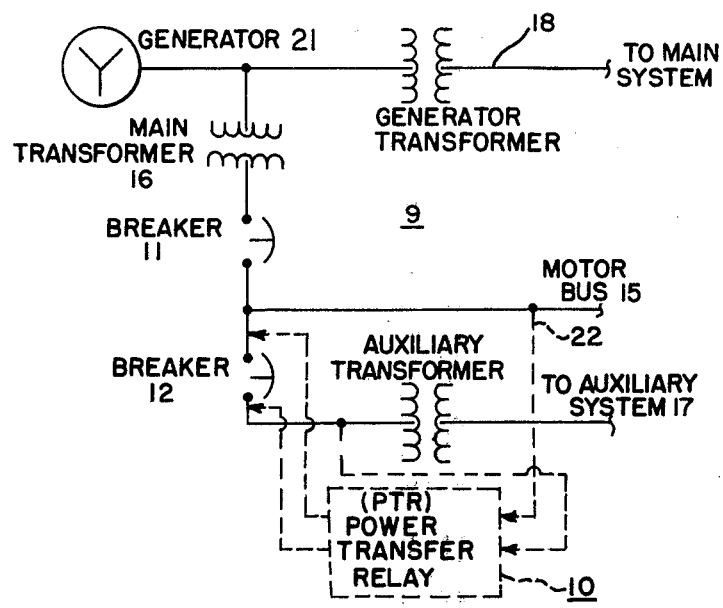
FIG. 1, which has been referred to above, is a simplified schematic diagram of a typical generating plant system in solid lines, and in dotted lines indicates the inventive transfer relay and its operating connection to the system.
Figure 2:
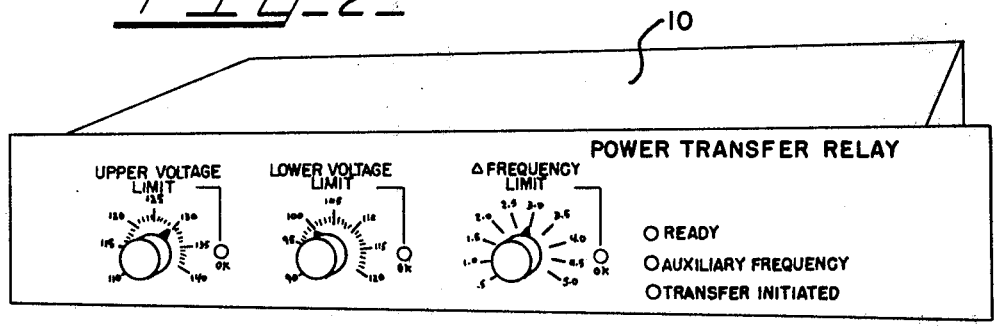
FIG. 2 is an isometric view of the overall inventive transfer relay circuitry.

As described above, FIG. 1 shows a typical system 9 wherein the inventive transfer relay circuitry 10 may be utilized. As also stated above, transfer relay circuitry 10 provides a high speed synchronous transfer of the motor bus 15 from the main system of the associated generator to an auxiliary system or source 17. FIG. 2 shows the front panel controls of the power transfer relay (PTR) 10. The upper voltage limit control is adjusted to the value which the auxiliary source voltage may not exceed if breaker closing is to be permitted. The lower voltage limit control is adjusted to the value which the auxiliary source voltage must exceed if breaker closing is to be permitted. The delta frequency limit control is adjusted to the value which the frequency difference must not exceed if breaker closing is to be permitted. The breaker closing time is set by jumpers, not shown, which are set in accordance with a type and model of breaker employed. The jumpers provided, adjust for various breaker closing times. Note the lights indicating the ready condition, the auxiliary voltage ok, the auxiliary frequency ok, and power transfer initiated.

BLOCK DIAGRAM OF INVENTIVE CIRCUITRY

Refer now to FIGS. 4 and 4A. A description of the inventive power transfer relay circuitry will first be given with reference to the block diagram of FIGS. 4 and 4A; subsequently the circuit details will be explained with reference to FIGS. 5 and 5A.

Refer now to FIG. 4. An input (lead 322) from the auxiliary power system 17 (FIG. 1) is connected through a transient protection circuit 323 and a step-down isolation transformer 324 to a zero crossing detector 325. Zero crossing detector 325 provides an indication when the auxiliary frequency is crossing the zero line, see the sketch labeled 330 in FIG. 4. An induced A.C. voltage, varying in frequency and amplitude, from the motor bus 15 is connected through lead 326, a transient protection circuit 323A and step-down isolation transformer 324A to a zero crossing detector 325A which provides an indication that the motor bus frequency is crossing the zero line.

The step-down transformers 324 and 324A are matched in phase delay, to minimize differential phase delay.

The output of zero crossing detector 325 is coupled to Nor gate 331 and to And gate 332. The output of zero crossing detector 325A is coupled to Nor gate 331, And gate 332 and to buffer amplifier 333. And gate 332 generates a pulse proportional to the time between negative zero crossing (0 neg.) frequency of the auxiliary and bus potential inputs; note the waveforms labeled 330 in FIG. 4. Nor gate 331 generates a pulse proportional to the time between positive zero crossing labeled (0 pos.) of the auxiliary and bus potential inputs.

The positive going output from the Nor gate 331 is coupled to a resettable integrator 334 which starts integration at the zero crossing point. The output of the resettable integrator 334 is coupled to a high speed precision sample and hold amplifier 339 which samples the output of the resettable integrator 334 slightly before the integrator is reset by the pulse from a time delay network 336, as will be explained hereinafter. The time delay network 336 generates a sampling command and a reset command.

Identical circuit functions are performed by the resettable integrator 334A, delay network 336A and the sample and hold amplifier 339A for the negative zero crossing phase difference output from And gate 332.

Buffer amplifier 333 inverts the output of the zero crossing detector 325A and couples its output to the resettable integrator 334B. Sample and hold amplifier 339B receives the output of the resettable integrator 334B, and together with delay network 336B functions in identical fashion as the phase differene circuitry described above. The output of the sample and hold amplifier 339B is a voltage proportional to the half period of the bus potential.

Summation amplifier 352 adds the output of the sample and hold amplifier 339B with a plus 10 volts reference, which is inverted and is coupled back through lead 343 to provide an error correction feedback function to the phase difference resettable integrators 334 and 334A. This feedback reduces the error in measuring phase difference at different bus frequencies.

The output of transformer 324 is also coupled to an active full wave rectifier 375 and to a phase-locked loop 377. (see lower left FIG. 4). The output of the full wave rectifier 375 is coupled through a low-pass filter 376 to provide a filtered DC voltage to a lower voltage comparitor 370, and to an upper voltage comparitor 371. The upper voltage comparitor 371 compares the output of the DC voltage from the low pass filter 376 with a portion of the 10 volt reference, also lower voltage comparitor 370 compares the DC voltage output from low-pass filter 376 with a portion of the 10 volt reference. Comparitors 370 and 371 are adjustable to vary the respective reference points.

The output of phase-lock loop 377 is coupled through lock detector 378 to logic network 369 (FIG. 4A). The phase-lock loop 377 and lock detector 378 provide a means to assure the auxiliary frequency operates within a selected band. The lock detector 378 determines if the phase-lock loop 377 is locked, and detector 378 interfaces with the logic network 369.

Summation amplifier 351 (see upper right FIG. 4) sums the output of the phase difference outputs from sample and hold amplifiers 339 and 339A. The output of summation amplifier 351 is a voltage proportional to the absolute value of the phase difference between the bus and auxiliary potentials. This voltage varies from zero to +10 volts for phase differences of 0° to 180°.

The output of the summation amplifier 351 is coupled to an active low pass filter 353 (see FIG. 4A) which removes unwanted frequency components from the output of summation amplifier 351. (The leads extending between FIGS. 4 and 4A, and FIGS. 5 and 5A are numbered identically to indicate circuit connection continuity). The output of filter 353 is coupled to a precision derivative amplifier 354 which measures the slope or time derivative of the filter 353 output and thus computes the time derivative of phase difference which is the delta or difference frequency. The output of amplifier 354 is coupled to an amplifier 355 which provides absolute value output which is coupled to a phase controlled filter 356. A second output from the summation amplifier 351 is also coupled to a phase upper and lower limit comparitor 357 which provides a dual comparison function to sense the phase difference voltage and provide an output to the filter 356. The filter 356 is turned on whenever the phase difference voltage is near zero or 180°. The filter 356 is turned off when the phase difference voltage is not near zero or near 180°.

A feedback voltage is coupled from the output of the filter 356 through lead 358 to modulate the signal input to dual comparitor 357. This is done because as the delta frequency increases, the modulations from absolute amplifier 355, due to alterations through zero degrees, widens since its output is proportional to delta frequency.

The output of the phase controlled filter 356 is thus proportional to the rate of change of phase difference and is coupled through lead 358 to a precision derivative amplifier 361 which differentiates the output of the phase controlled filter. The output of the amplifier 361 is proportional to the phase difference acceleration.

Summation amplifier 362 sums the output of the derivative amplifier 361 and the output of the phase controlled filter 356 to provide an output to a breaker time network 363 having a plurality of terminal connectors. By selecting the desired terminal the breaker time compensation is selected. Breaker time multiplier network 364 provides a multiplication of the breaker time selection to provide a gain of one or a gain of two.

The output of the breaker time multiplier network 364 is coupled to a precision comparitor 365 which compares the output of the summation amplifier 351 and the breaker time multiplier network 364. The input to the precision comparitor 365 is thus a phase difference input (from amplifier 351), and the output from the multiplier network 364 which provides a factor comprising the breaker time constant.

The output of the precision comparitor 365 is coupled to a derivative network 366 where the signal is differentiated to eliminate negative excursions and to provide an upper limit voltage. A positive pulse will be present whenever precision comparitor 365 senses the output of summation amplifier 351 equals the output of breaker time multiplier network 364, provided the output of amplifier 351 was initially greater than the output of network 364. The positive pulse occurs at the breaker closing initiation time before the zero phase difference.

An output is also coupled from the phase controlled filter 356 through lead 358 to the delta frequency comparitor 367 which is variable from 0.5 to 5.0 Hz. The output of comparitor 367 is coupled to the logic network 369 which receives additional inputs from a lower and upper voltage comparitors 370 and 371, lock detector 378, a turn on delay timer 373, a power supply monitor 374, and a buffer amplifier 375 indicating an initial transfer signal. The logic network 369 processes the inputs to provide a "close" signal through close timer 380 and optical isolator 382 to the solid state breaker close network 383. Network 383 is powdered from an isolated supply from power supply 372 and provides a signal which is coupled through transient protection 384 to provide the breaker "close" output.

The circuit of FIGS. 4 and 4A thus measures the phase difference between the bus and auxiliary potential inputs, determines the first and second time derivatives of the phase difference and compares these functions to provide a prediction of zero phase difference. Using the predicted zero difference, and knowing the time required to close the breaker will determine the point at which it is desirable to initiate closing the breaker. The circuit also sets upper and lower voltage limits, which the auxiliary voltage must be within, before closing occurs, see also FIG. 2. The various inputs are processed in a logic network to provide a decision or control function to transfer or connect the power from the auxiliary source to the motor bus.

DESCRIPTION OF SCHEMATIC DIAGRAM

Note that reference characters in the detailed circuit diagrams of FIGS. 5 and 5A which are the same as reference characters referring to the blocks of FIGS. 4 and 4A refer to like circuits or elements.

Phase Difference Measurements

The phase difference between the frequency of the auxiliary source and the bus potential frequency is measured as follows. The auxiliary source input is coupled across leads 322 and 27 to transient suppression circuit 323. The inductance of series connected fuse 23 the wire inductance and capacitor 24 form a low pass filter which rejects any high frequency signals and slows the rise time of any high speed transients.

A parallel connected varistor 25 whose heat energy rating matches fuse 23, limits the maximum differential voltage between the input terminals 322 and 27. Varistors 28 and 29 limit common mode voltages on terminals 322 and 27.

The output of transient protection circuit 323 is coupled to the primary winding of isolation step down tranformer 324. The voltage step down ratio is 20:1; and, with a nominal 120 VAC applied to the auxiliary input, the output voltage of the transformers is 6 VAC.

The output from transformer 324 is applied to zero crossing detector 325 of suitable known type. Resistor 33 provides current limiting to diodes 34 and 35. Diodes 34 and 35 protect amplifier 36 from possible damage from high voltage transients.

An input circuit similar to that labeled 323, 324 and 325, and indicated by the blocks labeled 323A, 324A and 325A, is provided for the motor bus input which as mentioned above is an induced voltage varying in amplitude and frequency.

The two transformers 324 and 324A are matched in phase delay, thus differential phase delay is minimized.

The output of zero crossing detectors 325 and 325A is buffered respectively by two hex inverters labeled 37A and 37B. The resistors 38 and 39 connected to inverter 37A form a divider which reduces the voltage range seen by CMOS Nor gate 331 and by the CMOS And gate 332. Similar resistors are connected to the output of inverter 37B.

Nor gate 331 generates a pulse proportional to the time between positive zero crossings (0 pos.) of the auxiliary and bus potential inputs. And gate 332 generates a pulse proportional to the time between negative zero crossings (0 neg.) of the inputs (see sketch labeled 330 in FIG. 4). The pulse amplitude from gates 331 and 332 is controlled by the voltage across capacitor 43.

The positive going zero crossing phase difference pulse from Nor gate 331 is coupled to amplifier 44 and in parallel through variable resistor 45 and series resistor 46 to a precision operational amplifier 47. Amplifier 47 is connected in parallel with an FET 48 to form a resettable integrator 334. Resistor 45 permits calibration of the integration constant of capacitor 49 connected across FET 48. FET 48 and resistor 51 form a reset switch, which allows the integration to begin at the same zero starting point, as will be further explained.

A high speed precision sample and hold amplifier 339 samples the output of amplifier 47 at a point which timewise is slightly before amplifier 47 is reset by the reset switch comprising FET 48 and resistor 51. A time delay network generally referenced as 336 and including amplifiers 44, 54, 55 and 56 generates the sampling command and the reset command. In network 336, amplifier 44 inverts the pulse proportional to phase difference, capacitor 57 and resistor 58 differentiate the pulse, and diode 59 rejects or shorts out, the negative derivative. Amplifier 54 drives a pulse stretching network comprising capacitor 62, diode 63 and resistor 64.

Amplifier 54 also drives a sample and hold amplifier 339 through resistor 61. When the input from amplifier 54 to amplifier 339 is positive, the voltage from amplifier 47 is sampled by amplifier 339.

The output from the pulse stretching network is coupled to buffer amplifier 55 to drive shift network 66 which delays the stretched pulse from amplifier 55. This delayed pulse is buffered by amplifier 56 and transistor 68. The collector of transistor 68 drives FET 48 which resets the integrator 334. The reset pulse from transistor 68 is delayed until the sample pulse is terminated. Resistor 51 provides a current limiting function.

Identical circuit functions are performed by the resettable integrator 334A, the delay network 336A and the sample and hold amplifier 339A for the output from And gate 332 which represents the negative going zero crossing phase difference.

Refer now to the buffer amplifier circuit 333 including And gate 71 which receives the output of the bus zero crossing detector 325A through inverter 37B. Resistors 72 and 73 scale the output of inverter 37B to 10 volts peak voltage. A precision resettable integrator 334B, a sample and hold amplifier 339B and a time delay network 336B generate the sampling command and reset command signals in an identical fashion as the phase difference circuitry previously described above with reference to Nor gate 331 and And gate 332.

The output of sample and hold amplifier 339B is a voltage proportional to the half period of the bus potential.

A summation amplifier 75, and the associated resistors 81, 81A and 83, add the output of amplifier 339B with +10 volts, and the circuit of amplifier 76 with resistors 82, 84 and 77 further amplifies, and inverts the output of amplifier 75.

The output of summation amplifier 76 is an error correction feedback function applied through lead 343 to phase difference Nor gate 331 and And gate 332 to reduce the error in measuring phase difference at different bus frequencies.

Summation amplifier 79 and resistors 85, 86, 87 and 88 sum the output of each phase difference sample and hold amplifier 339 through leads 80 and 89 respectively. Resistor 88 trims the output of amplifier 79 for any offset voltage which may have accumulated in previous circuits.

Without the error correction feedback theoretical worst case errors of the amplifier 79 output exceed an equivalent of 8.3° for a BUS frequency equal to 55 Hz, and exceed 10.1° for BUS frequency equal to 61 Hz. The present circuitry provides a fast (2 times the highest input frequency) means for phase difference measurement over a reasonable frequency range. Also, measurements have shown a high degree of accuracy; that is a maximum phase measurement error of 0.18° from 55 to 60 Hz, and a maximum error of 0.4° at 61 Hz. as compared to the 10.1° error without feedback.

Method of Phase Measurement

The method of synchronizing in accordance with the present invention involves measuring the phase difference between the frequency of the motor bus and frequency of the auxiliary system; determining the rate of change of phase difference, determining the phase difference acceleration, and comparing these functions. A prediction of zero phase difference is thus accomplished. Using the predicted zero phase difference, and knowing the time required for a given breaker to close, a phase difference can be calculated at which it is desirable to initiate the closing of the circuit breaker.

The method of measuring phase difference between the motor bus and auxiliary potential input utilizes a method and means for detecting the zero crossing of the motor bus voltage and auxiliary system voltage. The circuits for providing the zero crossing detection as well as the sample and hold, and the error correction feedback features have been described above.

Note that the negative going crossing as well as the positive going crossings of the motor bus and auxiliary frequencies are detected to generate control information. More specifically and as described above, a pulse proportional to the time between negative zero crossings of the motor bus and auxiliary voltage is generated; and, also a pulse proportional to the time between positive zero crossings of the motor bus and auxiliary potential voltage is generated.

The method of measuring phase difference between the motor bus and auxiliary potential will now be detailed with reference to FIGS. 6 and 7 and comprises, the following steps:

(a) the negative and positive zero crossings of the motor bus A.C. potential are detected and a pulse proportional thereto is provided, see FIGS. 6(a) and (d);

(b) the negative and positive zero crossings of the auxiliary system A.C. potential are detected and a pulse proportional thereto is provided, see FIGS. 6(b) and (c);

(c) a pulse proportional to time between negative zero crossings of the auxiliary and bus potential inputs is provided, see FIG. 6(e);

(d) a pulse proportional to the time between positive zero crossings of the auxiliary and bus potential inputs is provided, see FIG. 6(f)

(e) a pulse proportional to the phase difference is provided, see FIG. 6(g) and FIG. 7(a);

(f) the phase difference pulse is processed by differentiation, squaring, clipping, and stretching to provide sample and hold signals and reset signals, see FIGS. 7(b)–7(g) and 7(i);

(g) each pulse proportional to the phase difference is integrated starting at the zero point, see FIG. 7(h);

As described above the phase difference is compared with the rate of change of phase difference, phase difference acceleration and breaker timing.

Rate of Change of Phase Difference

The rate of change of phase difference is measured as follows. The output of amplifier 79 (FIG. 5A) is a voltage proportional to phase difference between the bus and auxiliary potentials. The output of amplifier 79 varies from 0 to +10 volts for phase difference of 0 to +180 degrees, respectively (FIG. 8a). Subcircuit 90, including capacitors 92 and 95, resistor 93 and 94 and amplifier 81 provide an active low pass filter function. A subcircuit 91 which is identical to subcircuit 90, is coupled in series thereto. The two subcircuits (90 and 91) generally labeled 353 function to remove unwanted frequency components from the output amplifier 79 which arise from the phase sampling process and are harmonically related to the sampling period.

A precision derivative amplifier subcircuit 354 including amplifier 96, coupling capacitor 97, resistor 98 and capacitor 99 measure the slope, or time derivative, of the filter 353 output (FIG. 8b). Since the output of the filter 353 is proportional to the difference in phase between the bus and auxiliary frequency, amplifier 354 thus computes the time derivative of phase difference, or the delta frequency. The output of amplifier 354, which is a square pulse varying in polarity, is coupled through lead 100 to amplifiers 101 and 102. Amplifier 101 and 102 and the associated subcircuit including diodes 103, 104 and the resistors generally labeled 105 function as an absolute value amplifier 335 (FIG. 8c).

FET 109, amplifier 108, resistor 110 and capacitor 111 form a phase controlled filter 356. Amplifiers 112, 113 and resistors 114, 115 and 116 form a dual comparitor 357 which senses the phase difference voltage and controls filter 356 through the circuit traceable via diodes 118 and 119, lead 126, amplifiers 120, 121, resistor 122 and transistor 123 to FET 109. The phase controlled filter 356 is turned on (maximum time constant) whenever the phase difference voltage is near 0 to 180 degrees. When the phase difference voltage is not near 0 to 180 degrees the filter 356 is turned off (minimum time constant) (FIG. 8d).

Variable resistor 125 is adjusted to eliminate any offset voltages from amplifier 108 or previous devices. Note that the output of amplifier 102 includes undulations due to the alternating polarity output from amplifier 96 which only occur near the 0 to 180 degrees of phase difference between the bus and auxiliary waveforms.

Resistor 117 provides a voltage to modulate the limits of dual comparitor 357. This is necessary because as delta frequency increases the undulations from the output of amplifier 102 widen, since the output of amplifier 108 is proportional to delta frequency (FIG. 8e).

As delta frequency increases, the comparison limits of comparitors 112 and 113 are increased also. The upper phase limit for turning on the phase controlled filter 356 is $156.4° - (\text{delta freq}) \, 0.5°/\text{Hz}$; and, the lower phase limit is $13.7° + (\text{delta freq}) \, 2.3°/\text{Hz}$. The output of amplifier 139 and the input to amplifier 146 are shown in FIG. 8f, and the output of amplifier 146 is shown in FIG. 8g. The foregoing is effective to generate a close pulse input (FIG. 8h) to And gate 211 in the logic network 369.

Means for Measuring Phase Difference Acceleration

The output of amplifier 108 (FIG. 5A upper center) is proportional to rate of change of phase difference, as previously mentioned, and is coupled through lead 131 to a precision derivative amplifier 361 comprising operational amplifier 126, capacitors 127, 128 and resistors 129 and 130. The output of amplifier 126 is the differentiated signal from amplifier 108 and is proportional to phase difference acceleration.

Summation amplifier 362 comprising amplifier 132 and resistors 133–136 effectively sums or adds the output of amplifier 108 to the output of amplifier 126. Resistor 135 provides a means for calibration, resistor 136 eliminates any offset voltages while resistors 133, 134 and 137 provide the desired summation constants.

Comparing Phase Difference with Rate of Change of Phase Difference, Phase Difference Acceleration and Breaker Timing The output of amplifier 132 is coupled through lead 140 to a breaker time network generally labeled 363. The breaker time is selected by selecting the desired terminal A-I. The selected terminal is shorted to terminal SC which couples the signal to one input of amplifier 139. A breaker time multiplier network 364 includes terminals 143 and 144. If terminal 143 is shorted to ground terminal 144, amplifier 139 provides a gain of two. If terminal 143 is open circuited then amplifier 139 provides a gain of one. Thus, the output of amplifier 139 is proportional to the output of the amplifier 132 output, multiplied by the breaker time constant.

Differential amplifier 146, resistors 147 and 149 and diode 148 form a precision comparitor 365. Resistor 149 and diode 148 provide positive feedback without altering the set point, because diode 148 is reversed biased until amplifier 146 is set. The input to the inverting terminal (−) of amplifier 146 is coupled through lead 160A from the output of amplifier 79, that is, the phase difference output. The noninverting (+) input to amplifier 146 is the output of amplifier 139 (FIG. 8f).

The output of amplifier 146 (FIG. 8g) is differentiated by capacitor 151 and resistor 152. Diode 153 eliminates negative excursions and diode 154 provides an upper voltage limit of 15 volts. A positive 15V pulse will be present whenever amplifier 146 is in transition to a set state and a negative 0.7V pulse is present whenever amplifier 146 changes to a reset state. This positive pulse occurs at the breaker closing time before zero phase difference.

Auxiliary Voltage Measurements

The upper and lower auxiliary voltage measurements are obtained as follows. Refer to the left hand center portion of FIG. 5. The output of auxiliary transformer 324 is coupled via lead 411 to an active full wave rectifier comprising amplifiers 161 and 167. The output of amplifier 167 is a low ripple DC voltage proportional to the auxiliary input potential. Resistors 163-166 provide the correct scaling while capacitors 162 and 168 together with resistor 169 form a low pass filter for smoothing the fullwave rectified voltage.

An upper voltage comparitor 371 comprising amplifier 171 and resistors 172-176 compares the output of amplifier 167 against a portion of the 10 volt reference to provide an indication on LED labeled L1 that the upper voltage limit is OK. The lower voltage comparitor 370 which is similar to the upper voltage comparitor 371 also compares the output of amplifier 167 to a portion of the 10 volt reference to provide an indication on the LED labeled L2 that the lower voltage limit is OK. When both the upper and lower voltage limits are OK, And gate 201 may be turned on to energize transistor 203 and actuate the relay K1 indicating that the auxiliary voltage is OK as will be explained.

The auxiliary frequency and delta frequency measurement circuits are as follows. The output of the auxiliary zero crossing detector 325 is a rectangular wave which is coupled through resistor 177 and capacitor 179 to provide a level shifted rectangular waveform to IC 180. IC 180, the capacitors 181-184 and the resistors 185-188 form a phase locked loop and lock detector 377-378. The phase locked loop's center frequency is determined by capacitor 181 and resistors 187 and 188, with resistor 188 providing the calibration means. Resistor 186 and capacitor 184 determine the phase locked loop's bandwith for locking. The lock detector, in the internal structure of the IC 180, determines if the phase locked loop is locked and interfaces with the logic section through resistor 189 and And gate 204.

Amplifier 191 together with capacitor 192 and resistors 193, 194 comprise the delta frequency comparitor 367. Resistor 197 and capacitor 192 form a low pass filter to reduce any ripple on the output of amplifier 108 which is proportional to the delta frequency. Comparison limits are made variable by resistor 193. The LED labeled L3 indicates when the delta frequency (ΔF) is OK.

Power Supply

The power supply is coupled to a 120VAC input and provides conventional full wave rectification to provide sources of +24 volts, +15 volts, +10 volts and −15 volts, filtering and over voltage protection. The conventional isolated power supply 372 provides rectified, filtered and current limited power for the solid state breaker close network as indicated in FIG. 4.

Logic Circuitry

The logic operation of the circuitry is as follows. And gate 201 receives the upper and lower auxiliary voltage limits from the upper and lower voltage comparitors 370 and 371. Transistor 203 closes relay K1 if the output of And gate 201 is logic 1. Note transistor 203 is connected through lead 393 to the transfer ready enabling transistor 394.

And gate 204 receives the delta frequency limit OK from amplifier 191, and the auxiliary frequency OK from IC 180 and couples a signal through lead 391 and transistor 202 to close relay K2 when the output from And gate 204 is a logic 1.

And gate 205 receives an input from And gate 201 and the transfer activated signal through amplifier 207. Gate 210 receives inputs from And gate 204 (via lead 391) and And gate 205 (via lead 392) and provides an output to And gate 211 (FIG. 8h). And gate 211 receives its other input from amplifier 146. And gate 213 processes, i.e. "ands" the output from And gate 211 with the supply monitoring functions.

And gate 214 processes, i.e. "ands" the output of And gate 213 with the output of reset timer 381 which is inverted by amplifier 216. The output of And gate 214 is inverted by inverter 217 and triggers close timer 380 and reset timer 381. The period of close timer 380 is 0.3 seconds while the period of the reset timer 381 is 10 seconds. The signal from inverter 216 blocks any subsequent triggers during the reset timer period because the input from inverter 216 to And gate 214 is a logic 0 for the period of reset timer, that is 10 seconds.

A low voltage monitor 220 including And gate 215 senses the low AC power voltage available for the power supply regulator. If the inputs to And gate 215 drop below approximately 6.5 volts, And gate 213 is blocked by diode 218 which is normally reversed biased. With 6.5 volts on either of the inputs to And gate 215, the corresponding voltage available for regulation by the power supply is approximately 18 volts. Transistor 219, amplifiers 251, 252 and resistors 253 and 255 form the +15 volt monitor for sensing loss of regulation. A 13 volt zener diode 254, supplies the base drive from amplifier 251 to transistor 219. Should the output of amplifier 251 drop below approximately 14 volts, transistor 219 will block current flow from optical couplers 221 and 222.

The output of close timer 380 drives optical couplers 221 and 222 generally labeled 382 during the 0.3 second close timer period. The dual optical couplers provide redundancy for increased reliability. Resistors 227 and 228 provide termination impedance for any thermally induced leakage currents within optical couplers 221 and 222. The outputs of couplers 221 and 222 comprise emitter followers which drive a breaker close network 383 comprising FETS 223, 224, 225 and 226 which are high voltage, high current, high power and high speed n channel MOS field effect transistors.

The output of optical coupler 221 and 222 is impressed across resistor 231 to provide a high voltage, which turns on FETS 223-226 to cause the FETS to change to a low impedance state. When the voltage cross resistor 231 is low, (approximately zero) FETS 224-226 are in a high impedance state or OFF.

The breaker close network 383 is powered by the isolated power supply 372. Transient suppression is provided by capacitors 235, 236, diodes 237-240, varistors 241, and resistors 244 and 245. Resistors 244 and 245, capacitor 235 and diode 239 provide a voltage snubber to slow the rate of voltage rise during turn off. Zener diode 238 is a high power, high speed diode which clamps any voltage between the breaker close terminals to safe limits as determined by the specifications for the FETS 223-226. Series connected diode 237 eliminates any negative voltages from appearing across FETS 223-226. Varistor 241 provides bidirectional voltage suppression while capacitor 236 filters any high frequency components which may appear across the breaker close terminal. Diode 240 allows diode clamping of inductive loads to provide a low voltage path for the inductive current during turn off of FETS 223-226.

Components

Many components utilized by the inventive circuit provide an important role in performance and reliability. The specific properties of various components are stated below.

Amplifiers 47, 75, 126 are each precision operational amplifier with extremely low, offset voltage, bias current and temperature drift; utilizing ion implantation, laser trimming and super beta input transistors.
Typical offset voltage at 25° C.±100 $\mu v$
Typical offset temperature coefficient 3 $\mu v/°$ C.
Typical bias current at 25° lna Amplifier 52 is a high speed precision sample and hold amplifier with very low droop rate, offset voltage and bias current; utilizing BIFET technology for ion implantation of field effect devices.
Typical offset voltage including temperature effects ±5 mv
Typical bias current ±5 na
Typical droop rate, c=0.10 $\mu f\pm 35$ mv/second Transistors 223, 224, 225 and 226 are each high, speed, voltage, current, power, MOS field effect transistor utilizing a vertical structure (VMOS) for low on resistance.
Breakdown voltage: 400 V minimum
Drain to source current: 5a maximum
Typical on resistance: 1.5Ω
Typical switching speed: 50 ns Capacitors 97, 148 and 181 are each precision hermatically sealed polysulfone film capacitor with very low temperature drift and excellent long term stability.
Capacitance accuracy: ±0.5% maximum
Typical temperature coefficient: −30 ppm/°c
Typical long term stability: ±0.2%/year Capacitor 41 is a polystyrene film capacitor with extremely low dielectric absorption and very high insulation resistance.
Typical dielectric absorption 0.05%
Typical insulation resistance 10 MΩ/$\mu f$
Resistors 87, 82, and 107 are each precision sealed metal film resistor with very low temperature drift and high accuracy.
Temperature coefficient 25 ppm/°c. maximum
Resistance accurary 0.1% maximum.

While the invention has been particularly shown and described with reference to a preferred embodiment thereof, it will be understood by those skilled in the art, that various changes in form and details may be made therein without departing from the spirit and scope of the invention.

We claim:

1. A power transfer relay circuit for providing synchronous transfer of power from a secondary A.C. source to a bus to which power from a first A.C. source has been interrupted such as due to a fault in said first A.C. source system which bus has an induced residual A.C. voltage which may be of a varying frequency, said transfer relay circuit controlling a circuit breaker having a defined closing time period for selectively connecting the secondary source to said bus; said power transfer relay circuit comprising, in combination, respective means for sensing the A.C. voltage frequency of the secondary source and the residual A.C. voltage frequency on the bus, means for measuring the phase difference between secondary voltage and bus voltage, means for measuring the rate of change of said phase difference, means for measuring said phase difference acceleration, and means for comparing said phase difference with the rate of change of said phase difference plus the phase difference acceleration and the circuit breaker timing period to provide a circuit breaker closing signal.

2. A power transfer relay as in claim 1 wherein the rate of change of said phase difference is definable as the frequency difference, and the rate of change of the frequency difference is definable as the phase difference acceleration.

3. Apparatus for synchronizing, within a selected range, the phase of a first stable frequency voltage with a second voltage which may vary in frequency, comprising in combination:
   a. means for detecting the positive going zero crossing of the said first voltage;
   b. means for detecting the positive going zero crossing of the second voltage;
   c. means for detecting the negative going zero crossing of said first voltage;
   d. means for detecting the negative going zero crossing of the second voltage.
   e. means providing a pulse proportional to the time between positive going zero crossings of the first and second voltages;
   f. means providing a pulse proportional to the time between negative going zero crossings of the first and second voltages;
   g. means for summing and averaging the time difference between the positive going zero crossings and the succeeding negative going zero crossings and for providing an indication of the phase difference of said first and second voltages within approximately one-half cycle of said first voltage to thereby obtain an accurate determination of phase difference between said voltages.

4. An apparatus as in claim 3 further including an error correction means whereby errors due to offset voltages and due to even harmonics tend to be eliminated.

5. A method of determining phase difference between a first frequency voltage and a second A.C. voltage which may vary in frequency consisting of the steps of:

a. detecting a positive going zero crossing of the first voltage;

b. detecting a positive going zero crossing of the second voltage;

c. detecting a negative going zero crossing of the first voltage;

d. detecting negative going zero crossing of the second voltage;

e. determining the time difference between the positive going zero crossing of the first voltage; and the positive going zero crossing of the second voltage;

f. determining the time difference between the negative going zero crossing of the first voltage and the negative going zero crossing of the second voltage; and, g. summing and averaging the time difference between said positive and negative zero crossings whereby a more accurate determination of said time difference and hence of phase difference between said first and second voltages is obtained.

* * * * *

UNITED STATES PATENT AND TRADEMARK OFFICE
CERTIFICATE OF CORRECTION

PATENT NO. : 4,256,972　　　　　　　　　　　Page 1 of 2
DATED : March 17, 1981
INVENTOR(S) : Michael A. Wyatt and Robert W. Beckwith It is certified that error appears in the above-identified patent and that said Letters Patent are hereby corrected as shown below:

Column 5, Line 1, "differene" should be --difference--.

Column 6, Line 44, "powdered" should be --powered--.

Column 9, Line 5, "crossing" should be --crossings--.

Column 9, Line 10, "crossing" should be --crossings--.

Column 10, Line 3, "Amplifier" should be --Amplifiers--.

Column 12, Line 34, "proceses" should be --processes--.

Column 13, Line 2, "n" should be --$\underline{n}$--.

Column 13, Line 46, "0.10" should be --0.01--.

Column 13, Line 47, after "high", cancel --,--.

Column 13, Line 48, after "voltage, cancel --,--.

Column 13, Line 48, after "power", cancel --,--.

UNITED STATES PATENT AND TRADEMARK OFFICE
CERTIFICATE OF CORRECTION

PATENT NO. : 4,256,972
DATED : March 17, 1981
INVENTOR(S) : Michael A. Wyatt and Robert W. Beckwith It is certified that error appears in the above-identified patent and that said Letters Patent are hereby corrected as shown below:

Column 13, Line 56, "matically" should be --metically--.

Column 14, Line 2, "accurary" should be --accuracy--.

Signed and Sealed this

First Day of September 1981

[SEAL]

Attest:

GERALD J. MOSSINGHOFF

Attesting Officer     Commissioner of Patents and Trademarks